(12) United States Patent
Yang

(10) Patent No.: US 8,319,973 B2
(45) Date of Patent: Nov. 27, 2012

(54) VCSEL ENABLED ACTIVE RESONATOR GYROSCOPE

(75) Inventor: Wei Yang, Minnetonka, MN (US)

(73) Assignee: Honeywell International Inc., Morristown, NJ (US)

( * ) Notice: Subject to any disclaimer, the term of this patent is extended or adjusted under 35 U.S.C. 154(b) by 870 days.

(21) Appl. No.: 12/420,386

(22) Filed: Apr. 8, 2009

(65) Prior Publication Data

US 2010/0257950 A1    Oct. 14, 2010

(51) Int. Cl.
*G01C 19/66* (2006.01)
(52) U.S. Cl. ........................................... 356/469
(58) Field of Classification Search .............. 356/459, 356/460, 468, 469, 470, 483, 461; 372/50.124, 372/50.22; 73/504.01
See application file for complete search history.

(56) References Cited

U.S. PATENT DOCUMENTS

| | | | | |
|---|---|---|---|---|
| 6,263,002 B1 * | 7/2001 | Hsu et al. | | 372/6 |
| 6,300,650 B1 * | 10/2001 | Sato | | 257/184 |
| 7,169,629 B2 | 1/2007 | Wu et al. | | 438/22 |
| 7,218,388 B1 | 5/2007 | Keeler et al. | | 356/73.1 |
| 7,239,135 B2 | 7/2007 | Abbink et al. | | 324/304 |
| 7,292,031 B2 | 11/2007 | Abbink et al. | | 324/304 |
| 7,324,205 B2 * | 1/2008 | Howard | | 356/450 |
| 7,359,059 B2 | 4/2008 | Lust et al. | | 356/459 |
| 7,362,443 B2 * | 4/2008 | Sanders et al. | | 356/470 |
| 7,372,886 B2 | 5/2008 | Song et al. | | 372/50.124 |
| 7,399,124 B2 | 7/2008 | Deng | | 385/88 |
| 7,589,841 B2 * | 9/2009 | Schwartz et al. | | 356/459 |
| 7,643,526 B1 * | 1/2010 | Lebby et al. | | 372/41 |
| 7,663,763 B2 * | 2/2010 | Feugnet et al. | | 356/470 |
| 7,701,584 B2 * | 4/2010 | Akanuma et al. | | 356/459 |
| 7,710,575 B2 * | 5/2010 | Schwartz et al. | | 356/459 |
| 8,102,893 B2 * | 1/2012 | Giaretta et al. | | 372/50.124 |
| 2003/0185269 A1 * | 10/2003 | Gutin | | 372/108 |
| 2004/0165641 A1 * | 8/2004 | Garnache et al. | | 372/97 |
| 2005/0012106 A1 | 1/2005 | Fathimulla et al. | | 257/80 |
| 2007/0194337 A1 | 8/2007 | Kondo | | 257/98 |
| 2007/0223001 A1 * | 9/2007 | Feugnet et al. | | 356/460 |
| 2008/0079947 A1 * | 4/2008 | Sanders et al. | | 356/461 |
| 2009/0021744 A1 | 1/2009 | Akanuma et al. | | 356/459 |
| 2009/0039881 A1 | 2/2009 | Kitching et al. | | 324/304 |

OTHER PUBLICATIONS

Subtune, Widely tuneable VCSELs using sub wavelength gratings Deliverable D3.1 Report on InP-based "half-VCSEL" design, Jul. 8, 2008, TU München, p. 3.*

(Continued)

*Primary Examiner* — Gregory J Toatley
*Assistant Examiner* — Dominic J Bologna
(74) *Attorney, Agent, or Firm* — Kermit D. Lopez; Luis M. Ortiz; Ortiz & Lopez, PLLC

(57) ABSTRACT

A interferometric optical gyroscope includes an active resonator comprising a half cavity vertical cavity surface emitting laser (half-VCSEL) operating as one of the mirrors that form the ring resonator. The half-VCSEL includes a bottom mirror stack and active layers formed on the bottom mirror stack and has a surface opposite the bottom mirror stack. Lack of a top mirror stack typically found in a VCSEL prevents the half-VCSEL from lasing, thus the half-VCSEL forms a reflective amplifier for the light circulating in the resonator. A single or multiple external light sources can be used to induce two counter-propagating beams in the resonator. Higher finesse due to the internal gain in the resonator enhances the sensitivity of the gyroscope.

20 Claims, 3 Drawing Sheets

OTHER PUBLICATIONS

Riemenschneider et al., Low-Cost Electrothermally Tunable Optical Microcavities Based on GaAs, Nov. 11, 2002, IEEE Photonics Technology Letters, vol. 14, No. 11, p. 1566.*

Murtagh et al., Photoreflectance spectroscopy study of vertical cavity surface emitting laser structures, 2004, Thin Solid Films 450, p. 148.*

Cole et al, Short-wavelength MEMS-tunable VCSELs, Sep. 29, 2008, vol. 16, No. 20, Optics Express. p. 16095.*

Mignot, Augustin, Single-frequency external-cavity semiconductor ring-laser gyroscope, Optics Letters vol. 34, No. 1, Jan. 1, 2009.*

Subtune Deliverable D3.1, Report on In-based "half-VCSEL" design, Jul. 1, 2008.*

Cole, Garrett, Short-wavelength MEMS-tunable VCSELs, Optics Express, Oct. 2008, vol. 16, No. 20.*

* cited by examiner

VCSEL ENABLED ACTIVE RESONATOR GYROSCOPE

FIELD OF THE INVENTION

The present invention is generally related to gyroscopes. The present invention is also related to vertical cavity surface emitting lasers (VCSELs). The present invention is also related to a half-VCSEL functioning as a combined amplifier and mirror. More particularly, the present invention is related to a vertical cavity surface emitting laser (VCSEL) enabled active interferometric optical gyroscope.

BACKGROUND

A vertical-cavity surface-emitting laser (VCSEL) is a type of semiconductor laser diode with laser beam emissions perpendicular from the top surface. VCSELs can be mass produced at low cost. For example, tens of thousands of VCSELs can be processed simultaneously on a three inch gallium arsenide (GaAs) wafer.

Optical gyroscopes based on Sagnac effect have no moving parts thus are considered more rugged and less susceptible to interference and damage from acceleration and shock than mechanical gyroscopes. A ring laser gyroscope (RLG) uses a gaseous gain medium in a ring cavity. It is able to support two stable counter-propagating lasing modes due to the Doppler broadening of the gain spectrum where the two counter-propagating modes are supported by different gas molecules separated in the momentum space therefore not competing for energy from the same molecules. Having two counter-propagating beams in the same cavity allows for cancellation of spurious frequency shift caused by minute but unavoidable cavity length changes due to thermal expansion and stress, thus the frequency difference of the two beams only reflects asymmetric effect such as rotation which causes the two counter-propagating beams to experience different cavity lengths. As such, an RLG can achieve extremely high sensitivity to rotation.

The gas laser in an RLG has drawbacks such as gas flow induced interference, leakage from diffusion, and electrode erosion which pose performance and lifetime limitations. Therefore, it is desirable to construct an RIG completely with solid-state components. However, because of the homogeneous broadening in solid-state gain media (no Doppler effect), the two counter-propagating beams compete for energy from the same source, making it extremely difficult to support two stable beams simultaneously.

Alternatively, an interferometric optical gyroscope employs a passive ring cavity or resonator and external light sources to measure the difference in optical length in opposite circular directions as the result of rotation, which can be implemented using free-space or fiber optics, such as interferometric fiber optical gyros (IFOG). The sensitivity of interferometric optical gyros can be enhanced using a high finesse ring resonator. Aside from reducing mirror or fiber losses, adding internal optical gain can be an effective approach to achieving high finesse. However, incorporating a gaseous or solid-state bulk gain medium in the resonator can be complex and problematic due to added scattering, birefringence, thermal, and flow effects. What is needed is a way to introduce optical gain in an optical resonator without these adverse effects.

SUMMARY OF THE INVENTION

The following summary is provided to facilitate an understanding of some of the features unique to the invention disclosed herein and is not intended to be a full description. A full appreciation of the various aspects of the embodiments can be gained by taking the entire specification, claims, drawings, and abstract as a whole.

It is, therefore, one aspect of the present invention to provide an improved interferometric optical gyroscope with an active resonator (referred hereafter as active resonator gyroscope) that utilizes a half vertical cavity surface emitting laser structure (half-VCSEL) functioning as an amplifier and mirror.

It is another aspect of the present invention to provide a new half-VCSEL operating as an amplifier and mirror that can be used to improve the sensitivity of interferometric optical gyroscopes.

The aforementioned aspects, features and advantages can now be achieved as described herein.

In accordance with features of the present invention, a new approach to active resonator gyroscopes is provided using a modified vertical cavity surface emitting laser (VCSEL) structure as an amplifier and mirror. The VCSEL amplifier/mirror described herein provides optical gain inside the resonator with minimal scattering and other bulk effects, such as birefringence, thermal expansion, and flow, etc., and can enable a new class of high-performance interferometric optical gyroscopes.

In accordance with other features of the present invention, a new half-VCSEL architecture can function as an amplifier and mirror for applications including, but not limited to, active resonator gyroscopes. The half-VCSEL described herein is similar to a typical VCSEL chip but without top mirror stacks. The lack of top mirror stacks prevents the half-VCSEL from lasing. Thus the half-VCSEL forms a reflective amplifier wherein the bottom mirror stack acts as the mirror for the resonator and optical gain is attained when light passes through the active layers above the mirror stack.

In accordance with features of the present invention, a half-VCSEL enabled active resonator gyroscope is provided that includes a bottom mirror stack and active layers formed on said bottom mirror stack and having a surface opposite the bottom mirror stack, wherein lack of a top mirror stack typically found in a VCSEL prevents the half-VCSEL from lasing. Thus, the half-VCSEL forms a reflective amplifier wherein the bottom mirror stack acts as a mirror for reflecting light circulating in the optical cavity.

In accordance with additional features of the present invention, a half-VCSEL can be fabricated on a GaAs substrate with a GaAs/AlGaAs mirror stack and active layers, such as GaAs/AlGaAs multiple quantum wells. Although a typical VCSEL chip has a GaAs/AlGaAs mirror stack beneath the active layers and a top mirror stack on the top surface, the half-VCSEL only has a mirror stack beneath the active layers, referred to as the "bottom mirror stack." For purpose of this invention, the top mirror is eliminated and can be replaced with a 1~10 μm conducting AlGaAs layer for current injection. An antireflection coating may be added to the top surface to increase light transmission into the half-VCSEL amplifier. The bottom GaAs/AlGaAs mirror stack can have reflectivity of over 99.5%. The light source for the gyroscope can be a single mode tunable diode laser, such as a distributed feedback (DFB) laser, with a wavelength in the 780-980 nm range for InGaAs/AlGaAs based devices. Its frequency $f_0$ can be tuned and locked to one of the stationary resonate frequencies of the active resonator for a gyroscope. It should be appreciated that the half-VCSEL as an amplifier can also have other applications beside gyroscopes wherein a light signal from a half-VCSEL amplifier mirror might be useful.

In one embodiment of the present invention, a four mirror active resonator can be provided that includes two passive spherical mirrors M2 and M3, one flat passive mirror M1, and a half-VCSEL operating as a fourth mirror M4 of the four mirror active resonator. The half-VCSEL includes a bottom mirror stack and active layers formed on said bottom mirror stack and having a surface opposite the bottom mirror stack, wherein lack of a top mirror stack typically found in a VCSEL prevents the half-VCSEL from lasing, thus the half-VCSEL forms a reflective amplifier wherein the bottom mirror stack acts as a mirror for reflecting light circulating in the cavity. A beam splitter can be provided that is configured to split light from a light source into two beams and frequency-shifted thereby creating two beams of frequencies $f_1$ and $f_2$, wherein the two beams are fed into the active resonator creating two counter-propagating beams. Photo detectors D1 and D2 can detect the intensity of the two beams via beam splitters BS2 and BS1. Frequencies $f_1$ and $f_2$ can be controlled by the outputs from the photo detector D1 and D2 so that $f_1$ and $f_2$ are locked-in with one or two different resonant frequencies of the ring resonator. The rotation rate of the gyroscope can be correlated to $f_1$-$f_2$.

In another embodiment of the present invention, a three mirror active resonator can be provided that includes two passive spherical mirrors M1 and M2, and the same aforementioned half-VCSEL operating as a third mirror M3. Photo detectors D1 and D2 can detect the intensity of the two counter-propagating beams via one of the passive mirrors and facilitate a closed-loop control of the output frequencies $f_1$ and $f_2$ from tunable light sources S1 and S2, and lock-in of $f_1$ and $f_2$ with one or two different resonant frequencies of the ring resonator. The rotation rate of the gyroscope can be correlated to $f_1$-$f_2$.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION OF THE INVENTION

Aspects and features of the invention discussed herein should not be construed in any limited sense. That is, it should be appreciated that such embodiments reveal details of the structure in preferred or alternative form necessary for a better understanding of the invention and may be subject to change by skilled persons within the scope of the invention and without departing from the concept thereof. The particular values and configurations discussed in these non-limiting examples can be varied and are cited merely to illustrate at least one embodiment and are not intended to limit the scope thereof.

At the heart of this invention is a VCSEL functioning as an amplifier and mirror. This VCSEL is similar to a typical VCSEL chip but without the top mirror stacks, thereby preventing the VCSEL from lasing. Thus, this VCSEL can also be referred to as a half vertical cavity surface emitting laser ("half-VCSEL") that can function as a reflective amplifier wherein the bottom mirror stack also acts as the mirror for the resonator and the optical gain is attained when light passes through the active layers above the bottom mirror stack and back through the surface of the active layer located opposite the bottom mirror stack.

Figure 1:
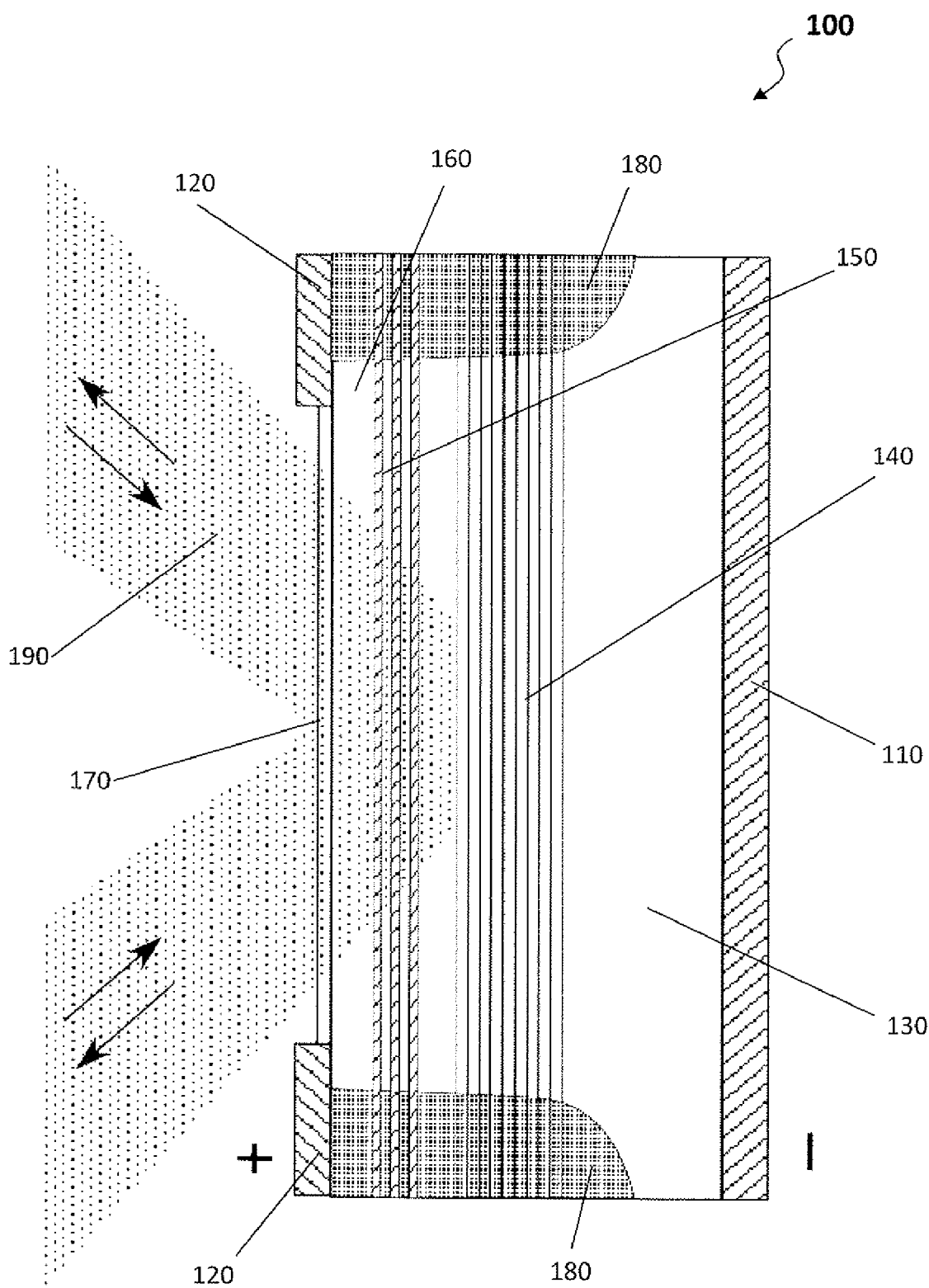
FIG. 1 illustrates a cross-sectional, side view of a half-VCSEL.

Referring to FIG. 1, a half-VCSEL 100 can be fabricated on a GaAs substrate 130 with a GaAs/AlGaAs mirror stack 140 and active layers 150, such as GaAs/AlGaAs multiple quantum wells. Contacts 110 and 120 provide power to half-VCSEL 100. Although a typical VCSEL chip has a mirror stack beneath the active layers and a top mirror stack on the top surface, the half-VCSEL 100 only has a GaAs/AlGaAs bottom mirror stack 140 located beneath the active layers 150, referred to as the "bottom mirror stack." For purpose of this invention, the top mirror is eliminated and can be replaced with a 1~10 μm conducting AlGaAs layer 160. The bottom GaAs/AlGaAs mirror stack 140 can have reflectivity of over 99.5%. Optionally, an antireflection coating 170 may be deposited on top of the conducting AlGaAs layer 160 to increase optical transmission of the counter-propagating beams 190 into the half-VCSEL amplifier. The half-VCSEL amplifier may also have an isolation region 180, formed by ion implant or selective oxidation, to confine the electrical current in the aperture region. It should be appreciated that the half-VCSEL as an amplifier can also have other applications beside gyroscopes wherein a light signal from a half-VCSEL amplifier mirror might be useful.

Figure 2:
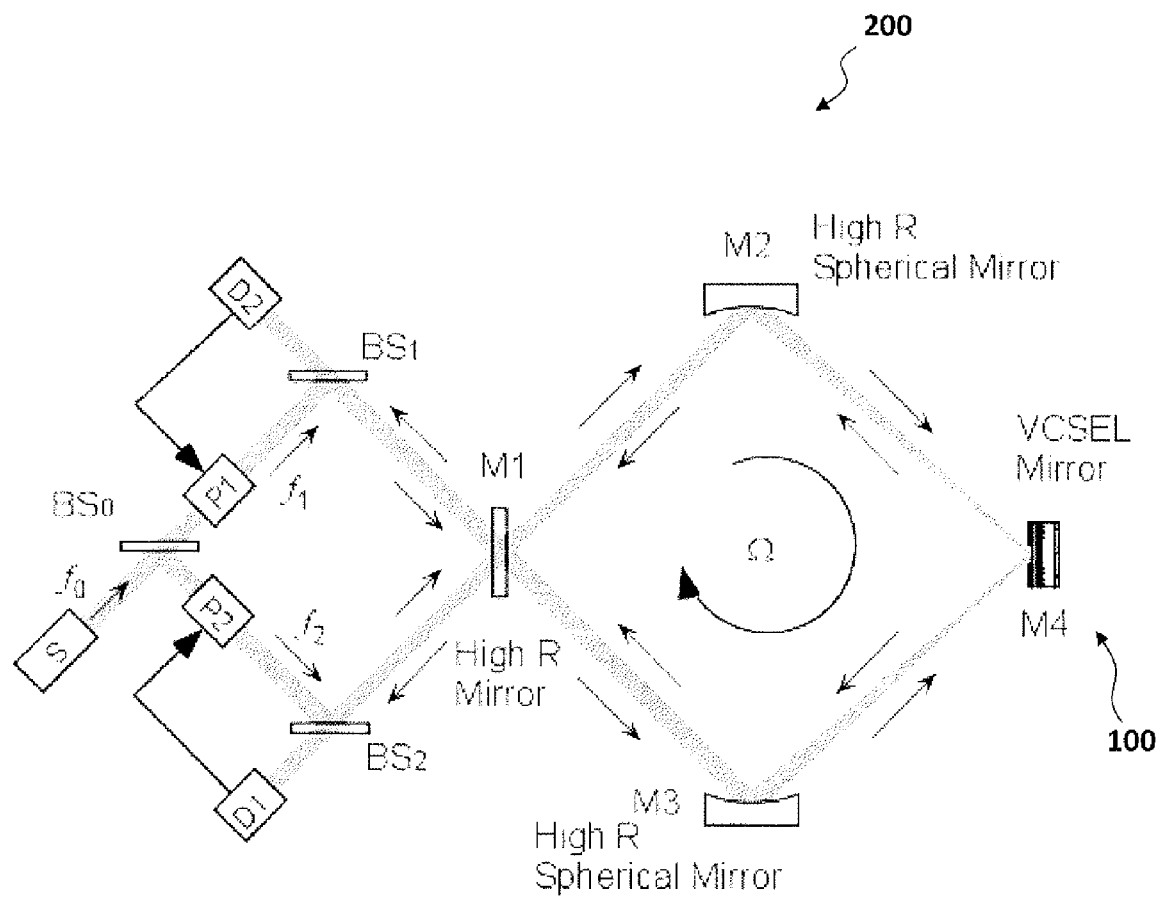
FIG. 2 illustrates a schematic with one half-VCSEL functioning as an active mirror M4, two passive spherical mirrors M2 and M3, and one flat passive mirror M1 used to form a four mirror active resonator for use with an interferometric optical gyroscope.

Referring to FIG. 2, a schematic diagram of a four mirror embodiment of a half-VCSEL enabled active resonator gyroscope 200 is shown that includes one half-VCSEL 100 operating as an amplifier and as a mirror M4, two passive spherical mirrors M2 and M3, and one flat passive mirror M1, which are all used to form the gyroscope's active resonator. It should be appreciated that active resonators using more than one half-VCSEL 100 amplifiers as a mirror are also possible. The half-VCSEL 100 as a mirror M4 can provide optical gain inside the resonator with minimal scattering and other bulk effects, such as scattering, birefringence, thermal expansion, and flow, etc. The half-VCSEL 100 enables a new class of high-performance optical resonator gyroscopes.

During operation, the light source (S) at $f_0$ is split to two beams by a beam splitter ($BS_0$) and phase-modulated by $P_1$ and $P_2$, creating two beams of frequencies $f_1$ and $f_2$. These two beams can be fed into the active resonator consisting of mirrors M1, M2, M3, and the half-VCSEL mirror M4, creating two counter-rotating beams in the resonator. The intensity of the two beams are detectable by photo detectors D1 and D2 via beam splitters BS2 and BS1. In a closed-loop configuration, $f_1$ and $f_2$ are locked-in with one or two resonant frequencies of the ring resonator using the photo detector outputs, thus the rotation rate is correlated to $f_1$-$f_2$. The use of a half-VCSEL 100 as an amplifier and mirror results in a much higher Q than a passive resonator, thus providing much higher sensitivity.

In the four-mirror embodiment, all the passive mirrors ideally have high reflection coatings. The reflectivity of the spherical and flat mirrors should ideally be at least 99.99%. The flat mirror M1 should also allow un-reflected light to pass through so that input and output coupling of light beams are possible. The half-VCSEL 100 can be a small chip (e.g. 300×300 μm²) with an active aperture between 5 to 40 μm.

The half-VCSEL 100 as a mirror M4 should be located near focal point of the spherical mirrors M2 and M3, where the waist of the resonant beams is formed. The beam spot on the half-VCSEL 100 as a mirror should be entirely within the aperture. The optical gain of the half-VCSEL 100 as an amplifier can be controlled by the current injection which must be regulated so that a sufficient gain can be achieved while not inducing lasing within the ring cavity.

Figure 3:
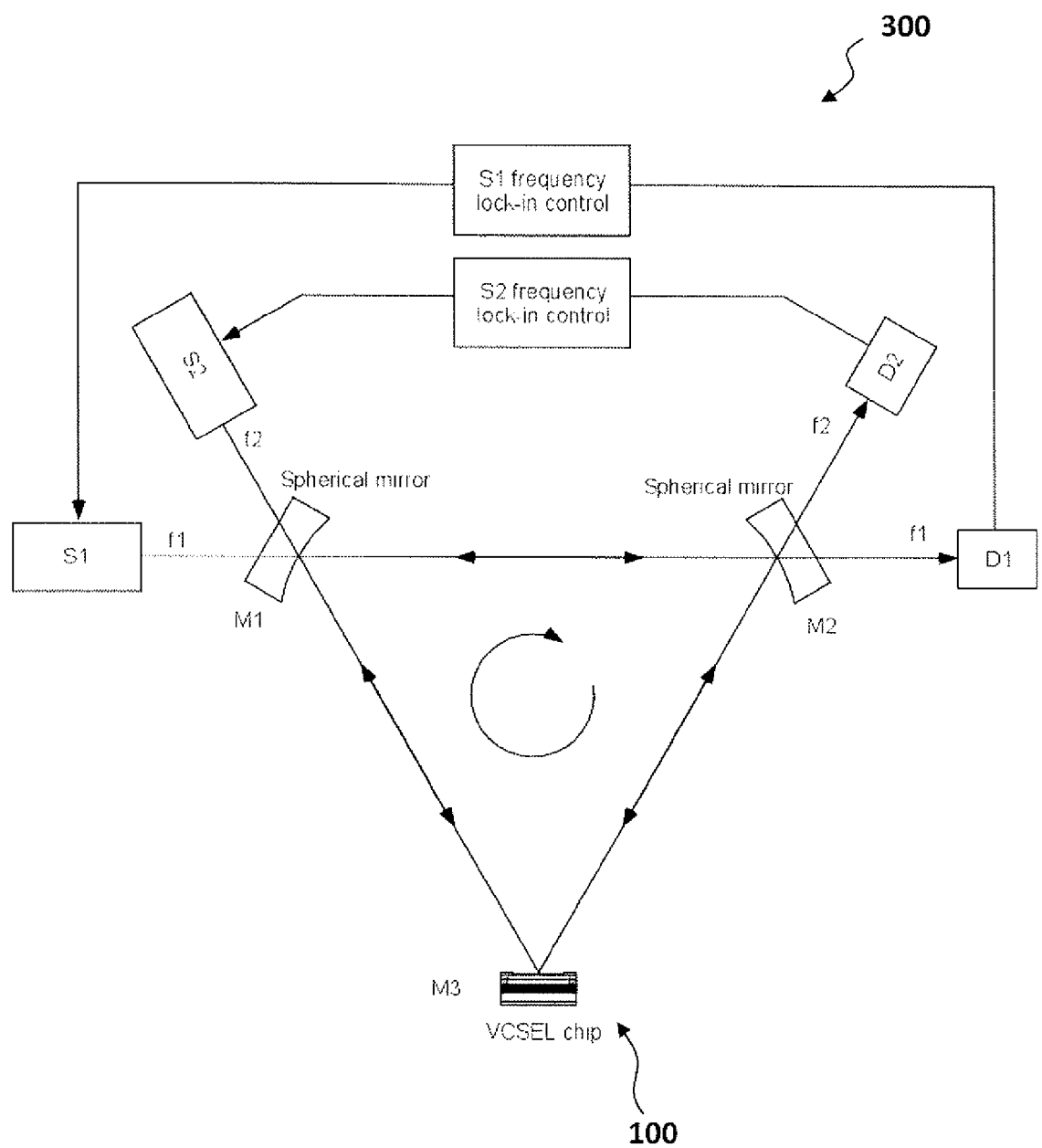
FIG. 3 illustrates a schematic with one half-VCSEL functioning as an active mirror M3 and two passive spherical mirrors M1 and M2 used to form a three mirror active resonator for use with an interferometric optical gyroscope.

Referring to FIG. 3, a three mirror embodiment is depicted. The active resonator is comprised of two passive spherical mirrors M1 and M2, and a half-VCSEL functioning as a reflective amplifier or mirror M3. Passive spherical mirrors M1 and M2 ideally have high reflection coatings and have reflectivity of at least 99.99%. Mirror M1 should allow light coupling into the active cavity from light sources S1 and S2. Mirror M2 should allow unreflected light to pass through so that detection of the two counter-propagating beam intensities via photo detectors D1 and D2 are possible. The half-VCSEL 100 can be a small chip (e.g. 300×300 μm$^2$) with an active aperture between 5 to 40 μm. The half-VCSEL 100 as a mirror M3 should be located near focal point of the spherical mirrors M1 and M2, where the waist of the resonant beams is formed. The beam spot on the half-VCSEL 100 as a mirror should be entirely within the aperture. The optical gain of the half-VCSEL 100 as an amplifier can be controlled by the current injection which must be regulated so that a sufficient gain can be achieved while not inducing lasing within the ring cavity.

During operation for the three mirror embodiment, the light sources S1 and S2 emit single mode laser beams at frequencies $f_1$ and $f_2$, which are tunable and locked-in with one or two resonant frequencies of the ring resonator via closed-loop control using feedbacks from photo detectors D1 and D2. These two beams can be fed into the resonator via M1, creating two counter-propagating beams in the resonator and the rotation rate of the gyroscope is correlated to $f_1$-$f_2$. The intensity of the two beams are detectable by photo detectors D1 and D2 via M2. In practice, $f_1$-$f_2$ can be measured by combining the two output beams at M2 and generating a beat signal at frequency $f_1$-$f_2$, which corresponds to the rotation rate. As in the four mirror embodiment, the use of a half-VCSEL 100 as an amplifier and mirror results in a much higher Q than a passive resonator, thus providing much higher sensitivity.

The reduced back scattering in the aforementioned active resonators is primarily due to the single crystalline VCSEL material (such as AlGaAs), which is free of grain boundaries and other inhomogeneities. Secondly, the epitaxtial surface of the VCSEL structure can be atomically smooth, resulting in little surface scattering. Another important feature of the VCSEL amplifier is the extremely short optical path, e.g., less than 10 μm round trip, which further reduces scattering and other bulk effects. The back scattering can also be reduced by virtue of the longer wavelength, i.e. 850 nm vs. 632.8 nm of HeNe laser. Therefore, a VCSEL amplifier-based active resonator described herein can achieve very high quality number Q by the optical amplification, and low back scattering on low-scattering surfaces. The resonator should ideally enable extremely sensitive measurement of change in resonant frequency (or wavelength) due to in-plane rotation.

The VCSEL amplifier resonator can be easily driven by a DC current source at 1-100 mA and about 1.2 V. The driving circuit is much simpler than that for a HeNe laser or a solid state laser due to its low voltage operation. The resonator is scalable because the chip size can be independent of the resonator size, it can be built in 1-10 cm scales. The half-VCSEL amplifier can be expected to have long lifetime and reliability as demonstrated in numerous diode laser applications.

The concept of this invention can be implemented in various platforms and different sizes depending on performance specifications. Most components are commercially available. The device provides angular rate sensing of one axis thus three orthogonal units are needed to provide full angular measurement. The applications include navigation, flight control, vehicle stabilization, etc.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. An active resonator gyroscope apparatus, comprising:
   an active ring resonator comprising at least three mirrors wherein at least one of the at least three mirrors comprises a half vertical cavity surface emitting laser operating as an active mirror and the rest the at least three mirrors comprise passive mirrors and wherein energy is supplied to said half vertical cavity surface emitting at such an intensity that said active ring resonator is below its lasing threshold;
   external light beam 1 at optical frequency $f_1$;
   external light beam 2 at optical frequency $f_2$; and
   means to feed light beam 1 and light beam 2 into said active ring resonator to propagate in counter-rotating directions within the active ring resonator; and
   photo detectors D1 and D2 for detecting intensity of the two beams via one or two of the passive mirrors;
   wherein $f_1$ and $f_2$ are locked-in with one or two different resonant frequencies of the active ring resonator using outputs from the photo detector D1 and D2, and rotation rate of the gyroscope is correlated to $f_1$-$f_2$.

2. The apparatus of claim 1, wherein said half vertical cavity surface emitting laser operating as one of the mirrors in the active resonator further comprises:
   a bottom mirror stack; and
   active layers capable of optical amplification at said optical frequencies f1 and f2 formed on said bottom mirror stack and having a surface opposite the bottom mirror stack, wherein lack of a top mirror stack typically found in a vertical cavity surface emitting laser prevents the half vertical cavity surface emitting laser from lasing, thus the half vertical cavity surface emitting laser forms a reflective amplifier wherein the bottom mirror stack acts as a mirror for reflecting light back passing through active layers.

3. The apparatus of claim 2, wherein optical gain is attained for the active resonator gyroscope when light passes through the active layers located above the bottom mirror stack and exits through the surface of the half vertical cavity surface emitting laser.

4. The apparatus of claim 2, wherein the half vertical cavity surface emitting laser is fabricated on a GaAs substrate and includes multiple layers of GaAs and AlGaAs for the bottom mirror stack and multiple layers of GaAs and AlGaAs for the active layers.

5. The apparatus of claim 2, wherein the top mirror stack typically found in a vertical cavity surface emitting laser is replaced with a 1~10 micrometers of conducting AlGaAs contact layer.

6. The apparatus of claim 4, wherein the bottom mirror stack includes a reflectivity of over 99.5%.

7. The apparatus of claim 4, further comprising an antireflection coating on the top surface.

8. The apparatus of claim 1, wherein external light beam 1 and external light beam 2 are provided by splitting a laser beam from a single laser source and frequency shifting said external light beam 1 to said optical frequency $f_1$ and frequency shifting said external light beam 2 to said optical frequency $f_2$ utilizing optical modulators.

9. The apparatus of claim 1, wherein external light beam 1 and external light beam 2 are provided by two laser diodes with tunable frequencies.

10. The apparatus of claim 1, wherein $f_1$-$f_2$ is measured by extracting and combining the two counter-propagating beams via one of the mirrors and measuring a beat frequency produced by the two beams.

11. The apparatus of claim 8, wherein a difference of beam frequencies $f_1$ and $f_2$ is extracted from input signals to said optical modulators.

12. The apparatus of claim 1, wherein at least two of the passive mirrors are spherical.

13. The apparatus of claim 1, wherein frequencies of the two counter-propagating beams $f_1$ and $f_2$ are locked to two adjacent stationary resonant frequencies of the active resonator.

14. An active ring resonator gyroscope apparatus, comprising:
   an active ring resonator comprising at least three mirrors wherein at least one of the at least three mirrors comprises a half vertical cavity surface emitting laser operating as an active mirror and the rest the at least three mirrors comprise passive mirrors and wherein energy is supplied to said half vertical cavity surface emitting at such an intensity that said active ring resonator is below its lasing threshold;
   external light beam 1 at optical frequency $f_1$;
   external light beam 2 at optical frequency $f_2$; and
   means to feed light beam 1 and light beam 2 into said active ring resonator to propagate in counter-rotating directions within the active ring resonator; and
   photo detectors D1 and D2 for detecting intensity of the two beams via one or two of the passive mirrors;
   wherein $f_1$ and $f_2$ are locked-in with one or two different resonant frequencies of the active ring resonator using outputs from the photo detector D1 and D2, and rotation rate of the gyroscope is correlated to $f_1$-$f_2$;
   wherein optical gain is attained for the active resonator gyroscope when light passes through the active layers located above the bottom mirror stack and exits through the surface of the half vertical cavity surface emitting laser.

15. The apparatus of claim 14, wherein said half vertical cavity surface emitting laser operating as one of the mirrors in the active resonator further comprises:
   a bottom mirror stack; and
   active layers capable of optical amplification at said optical frequencies f1 and f2 formed on said bottom mirror stack and having a surface opposite the bottom mirror stack, wherein lack of a top mirror stack typically found in a vertical cavity surface emitting laser prevents the half vertical cavity surface emitting laser from lasing, thus the half vertical cavity surface emitting laser forms a reflective amplifier wherein the bottom mirror stack acts as a mirror for reflecting light back passing through active layers.

16. The apparatus of claim 15, wherein the half vertical cavity surface emitting laser is fabricated on a GaAs substrate and includes multiple layers of GaAs and AlGaAs for the bottom mirror stack and multiple layers of GaAs and AlGaAs for the active layers.

17. The apparatus of claim 15, wherein the top mirror stack typically found in a vertical cavity surface emitting laser is replaced with a 1~10 micrometers of conducting AlGaAs contact layer.

18. The apparatus of claim 15, wherein the bottom or stack includes a reflectivity of over 99.5%.

19. The apparatus of claim 15, further comprising an antireflection coating on the top surface.

20. An active ring resonator gyroscope apparatus, comprising:
   an active ring resonator comprising at least three mirrors wherein at least one of the at least three mirrors comprises a half vertical cavity surface emitting laser operating as an active mirror and the rest the at least three mirrors comprise passive mirrors and wherein energy is supplied to said half vertical cavity surface emitting at such an intensity that said active ring resonator is below its lasing threshold;
   external light beam 1 at optical frequency $f_1$;
   external light beam 2 at optical frequency $f_2$; and
   means to feed light beam 1 and light beam 2 into said active ring resonator to propagate in counter-rotating directions within the active ring resonator; and
   photo detectors D1 and D2 for detecting intensity of the two beams via one or two of the passive mirrors;
   wherein $f_1$ and $f_2$ are locked-in with one or two different resonant frequencies of the active ring resonator using outputs from the photo detector D1 and D2, and rotation rate of the gyroscope is correlated to $f_1$-$f_2$; and
   wherein $f_1$-$f_2$, is measured by extracting and combining the two counter-propagating beams via one of the mirrors and measuring a beat frequency produced by the two beams.

* * * * *